US010505594B2

(12) United States Patent
Breems

(10) Patent No.: US 10,505,594 B2
(45) Date of Patent: Dec. 10, 2019

(54) WIRELESS COMMUNICATION UNIT, MODULATION CIRCUIT AND METHOD FOR FREQUENCY-DEPENDENT ADJUSTMENT THEREOF

(71) Applicant: NXP B.V., Eindhoven (NL)

(72) Inventor: Lucien Breems, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/221,802

(22) Filed: Dec. 17, 2018

(65) Prior Publication Data
US 2019/0215034 A1 Jul. 11, 2019

(30) Foreign Application Priority Data
Jan. 10, 2018 (EP) ..................................... 18151039

(51) Int. Cl.
*H04B 7/04* (2017.01)
*H03M 3/00* (2006.01)
*H04B 1/40* (2015.01)

(52) U.S. Cl.
CPC ................ *H04B 7/04* (2013.01); *H03M 3/45* (2013.01); *H03M 3/454* (2013.01); *H03M 3/458* (2013.01); *H04B 1/40* (2013.01)

(58) Field of Classification Search
CPC ... H03F 1/0277; H04L 25/03057; H04B 7/04; H04B 1/40; H03M 3/45; H03M 3/454; H03M 3/458
See application file for complete search history.

(56) References Cited

U.S. PATENT DOCUMENTS 8,830,107 B1 9/2014 Karthaus
9,621,183 B2 4/2017 Baringer et al.
(Continued)

FOREIGN PATENT DOCUMENTS

CA 2244446 A1 2/1999

OTHER PUBLICATIONS

Englund, M., "A Programmable 0.7-2.7 GHz Direct ΔΣ Receiver in 40 nm CMOS", IEEE Journal of Solid-State Circuits, vol. 50, No. 3, Mar. 2015.
(Continued)

*Primary Examiner* — Sung S Ahn

(57) ABSTRACT

A communication unit (300, 400, 500) is described that includes at least one antenna (302, 402, 502); a plurality of radio frequency (RF) circuits (304, 310, 404, 410) respectively coupled to at least one antenna (302, 402, 502); at least one sigma-delta modulator (316, 416, 616, 816) comprising a number of stages, each stage comprising at least one signal-feedforward coefficient (603, 604, 605), a filter and a feedback gain element, the at least one sigma-delta modulator (316, 416, 616, 816) coupled to the plurality of RF circuits (304, 310, 404, 410) and configured to perform sigma-delta modulation; and a controller (340, 440, 640, 840) operably coupled to the at least one sigma-delta modulator (316, 416, 616, 816). The at least one sigma-delta modulator (316, 416, 616, 816) comprises an input (315, 415, 602, 801, 802, 902) configured to receive multiple multi-phase input signals and the controller (340, 440, 640, 840) is configured to adjust the at least one signal-feedforward coefficient (603, 604, 605) of the at least one sigma-delta modulator (316, 416, 616, 816) when combining the multiple multi-phase input signals.

20 Claims, 7 Drawing Sheets

(56) References Cited

U.S. PATENT DOCUMENTS

| | | | |
|---|---|---|---|
| 2004/0087294 A1 | 5/2004 | Wang | |
| 2009/0066549 A1* | 3/2009 | Thomsen | H03M 3/482 |
| | | | 341/143 |
| 2015/0171888 A1* | 6/2015 | Breems | H03M 3/368 |
| | | | 341/143 |
| 2016/0315654 A1 | 10/2016 | Talty et al. | |

OTHER PUBLICATIONS

Jiang, X., "A Low-Power, High-Fidelity Stereo Audio Codec in 0.13 μm CMOS", IEEE Journal of Solid-State Circuits,vol. 47, No. 5, May 2012.

Norsworthy, S., "Delta-Sigma Data Converters: Theory, Design, and Simulation", Wiley-IEEE Press, Oct. 1996.

Yamamoto, K., "A Delta-Sigma Modulator With a Widely Programmable Center Frequency and 82-dB Peak SNDR", IEEE Journal of Solid-State Circuits, vol. 43, No. 8, Aug. 2008.

\* cited by examiner

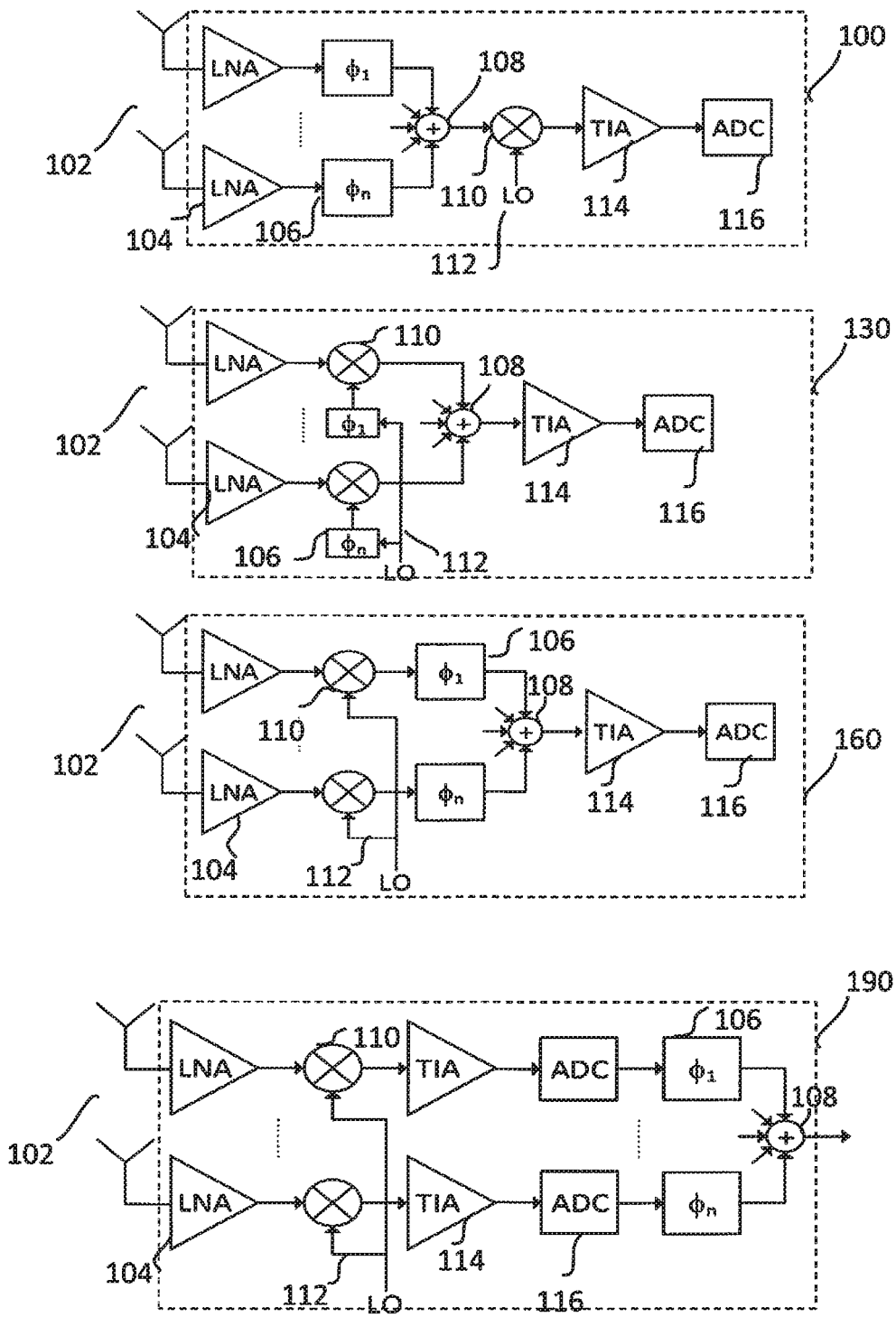
FIG. 1 – Prior Art

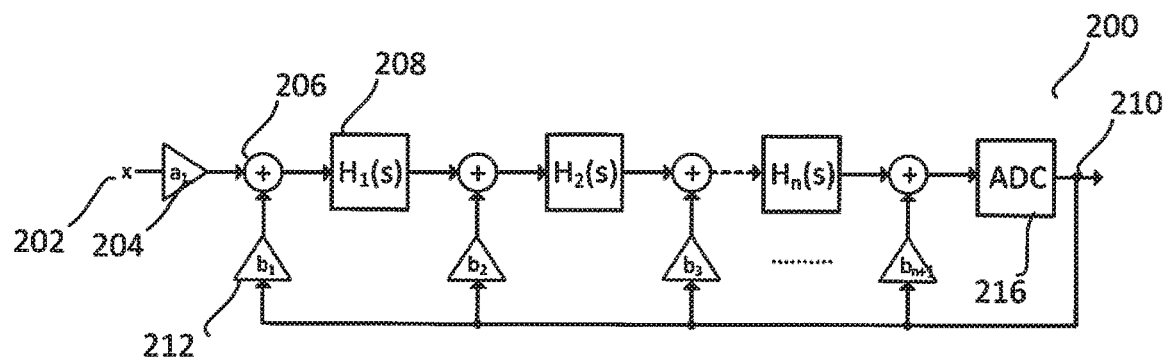
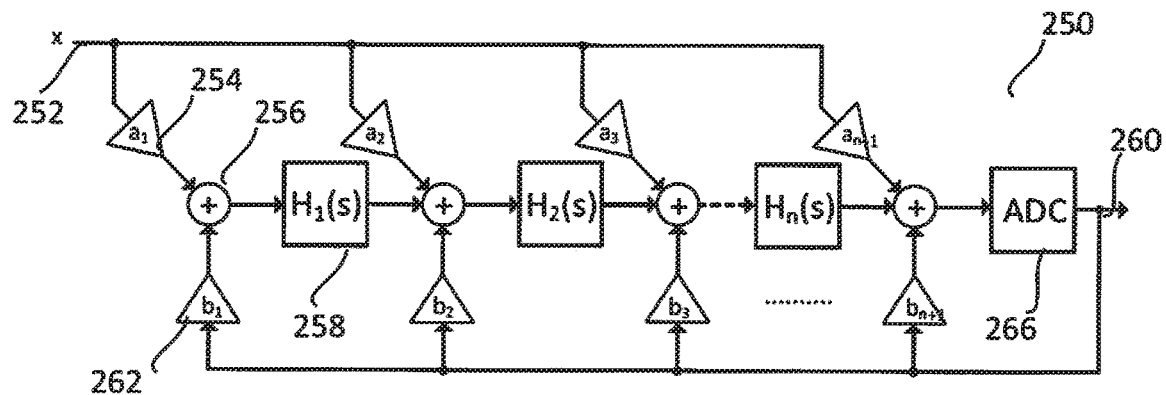
FIG. 2 – Prior Art

WIRELESS COMMUNICATION UNIT, MODULATION CIRCUIT AND METHOD FOR FREQUENCY-DEPENDENT ADJUSTMENT THEREOF

CROSS-REFERENCE TO RELATED APPLICATIONS

This application claims the priority under 35 U.S.C. § 119 of European Patent application no. 18151039.7, filed on 10 Jan. 2018, the contents of which are incorporated by reference herein.

FIELD OF THE INVENTION

The field of the invention relates to a wireless communication unit that includes a number of antennas arranged to perform frequency dependent adjustment of signals and a sigma-delta modulation circuit therefor. The invention is applicable to, but not limited to, beam steering functionality and/or image rejection improvement as a frequency dependent gain/phase transfer adjustment for interference cancellation, for a multiple-in serial-out (MISO) receiver or multiple-in multiple-out (MIMO) communication unit employing a sigma-delta analog-to-digital converter (ADC), and a method therefor.

BACKGROUND OF THE INVENTION

The evolution of mass-consumer wireless communication products balances a compromise between the demands of the users for ever higher data rate and quality of service and the demands of the service-providers and manufacturers for cost reduction, which ultimately leads to products that are physically possible to produce and operate efficiently that aim to satisfy user demands. The high data rate wireless communication products need large channel capacity, which can be achieved by both wide signal bandwidths and maintenance of a high signal-to-noise (SNR) ratio. A power-efficient approach adopted by a number of the evolving wireless communication standards is to choose SNR levels that do not lead to a too large power consumption, whilst utilizing high radio frequency (RF) carriers that make available wide signal bandwidths. However, it is known that the propagation losses increase at high RF, which can be compensated for by increasing the antenna gain.

As a consequence, phased array transceiver architectures have been developed for new mass-consumer wireless communication applications, which can effectively increase the antenna gain. The phased-array concept uses a-priori information about the location of the communicating party to form a directed (rather than omni-directional) beam between the transmitting and receiving communication units or the radar unit and a target object. Thus, communication energy is used where needed, which effectively increases the directivity of the antenna. Such a spatial selectivity is moreover very much required (or at least desired) for the attenuation of unwanted signals, i.e. blockers and interferers, in order to guarantee a particular quality of service. With such approaches, the desired signal is constructively combined, whilst the spatially adjacent signal interferences are destructively combined.

A number of current communication applications employ multiple receivers and transmitters (the combination of which is referred to as transceivers (TRx)), such as some mobile communications and commercial automotive radar sensors. Typically, multiple receivers and transmitters are implemented as a phased array antenna system, in order to improve the output power, receiver sensitivity and angular resolution for directed wirelessly transmitted and received signals. A microcontroller unit (MCU) performs digital control of the transceiver circuits and digital signal processing of the digitized data in order to output processed data. Such multiple-path architectures with multiple distinct outputs are typically referred to as multiple-in multiple-out (MIMO), whereas multiple-path architectures with a single distinct output (after summation/processing) are typically referred to as multiple-in single-out (MISO).

Another array-based approach to increase the overall communication capacity is to use MIMO communication links, where multiple independent streams are being used between the parties. Thus, a single base-station, for example, can serve multiple customers, which increases the overall utilization efficiency of the available channel capacity, but also significantly reduces the costs for the service providers. However, such an approach requires an array of ADCs, which thereafter requires all prohibitively large amounts of power and renders itself practically unrealistic when considering the current state-of-the-art of IC technologies. Unfortunately, the phased array receivers are practically bounded by the power dissipation, and hence their power efficiency is important to achieving a high performance.

FIG. 1 illustrates various block diagrams of known MIMO or MISO receiver architectures. Each of the receiver architectures include standard components, such as a plurality (or an array) of receiver antennas 102, each coupled to a respective low noise amplifier (LNA) 104 and thereafter a down-mixer 110 that receives a local oscillator signal 112. The output of the down-mixer is input to a transimpedance amplifier (TIA) 114 and then an analog to digital converter (ADC) 116 to produce a digital output of the wireless signal received across the plurality (or array) of receiver antennas 102. Each of the receiver architectures includes a phase shifting component 106.

The first three receiver architectures implement analog beam steering using a phased array summation of the signal as early as possible to implement spatial selectivity, which is a power-efficient approach (to be checked). A first example receiver architecture 100 illustrates a known technique whereby beam steering of the wireless signal received across the plurality (or array) of receiver antennas 102 is performed by a RF phase shifting component 106 in the RF domain, and typically immediately after the LNA 104. In this example, the outputs of the respective phase shifted signals are summed in summing junction 108, before the combined RF signal is down-converted by down-mixer 108. The first example receiver 100 therefore requires a number of RF phase shifting components 106, which are both bulky and costly.

A second example receiver architecture 130 illustrates a known technique whereby beam steering of the wireless signal received across the plurality (or array) of receiver antennas 102 is also performed in the RF domain using LO phase shifting components 106 in order to adjust the phase of the received RF signal following down-conversion by the down-mixer 110. In this example, the outputs of the respective phase shifted and down-converted signals are summed in summing junction 108, before the analog baseband signal is input to a TIA 114 and then an ADC 116 to produce a digital output of the wireless signal received across the plurality (or array) of receiver antennas 102 and respectively phase shifted. However, the second example receiver 130 therefore also requires a number of LO phase shifting components 106, which are both bulky and.

A third example receiver architecture 160 illustrates a known technique whereby beam steering of the wireless signal received across the plurality (or array) of receiver antennas 102 is performed in an intermediate frequency (IF) or baseband domain using IF or analog baseband phase shifting components 106 to adjust the phase of the received and down-converted RF signal. In this example, the outputs of the respective down-mixers 110 are respectively phase-shifted and summed in summing junction 108, before the analog baseband signal is input to a TIA 114 and then an ADC 116 to produce a digital output of the wireless signal received across the plurality (or array) of receiver antennas 102. However, the third example receiver 160 requires accurate analog delays to provide receiver beam steering, which is complex and difficult to readily implement.

The analog beam steering approach is theoretically able to remove (or substantially remove) any unwanted signals based on spatial selectivity and, hence, may relax the dynamic range requirements for all electronic building blocks beyond the phased-array signal summation, e.g. mixers and ADC(s). However, such an approach that requires receiving multiple streams is problematic, since the multiple instantiations of the receiver for each data path in, say, a communication base-station, results in a too large IC footprint area and power consumption. Additionally, the cost is increased. Furthermore, for the first and third examples where the analog phase shifters (implementing beam steering) are located in the signal path, the receiver architecture poses tough requirements on their noise and linearity performance, thereby resulting in high power consumption and low efficiency.

Alternatively, digital beam-steering can serve multiple streams by realizing the phased-array signal summation in the digital domain, i.e. after the ADCs. A fourth example receiver architecture 190 illustrates a known technique whereby beam steering of the wireless signal received across the plurality (or array) of receiver antennas 102 is performed in the digital domain whereby phase shifting is performed after respective analog-to-digital conversion of the multiple received signals. Here, no noise or non-linearity is added to the signal. However, the fourth example receiver 190 requires a number of accurate ADCs to provide receiver beam steering, which is complex and space consuming in an IC implementation. Furthermore, the spatial selectivity, and hence the interferer rejection, also takes place only in the digital domain. The design requirements for the electronic components in the receiver chain are significantly increased in comparison with the analog beam steering approaches. A larger dynamic range is also required for filters, mixers, ADCs, which increases so much so that the increased power consumption makes this approach practically infeasible. In addition, for each antenna, a full receiver path with LNA, mixers, TIAs and ADC is required for each received signal.

Thus, a mechanism is needed to provide improved beam steering for communication units (with transmitters and/or receivers) that use multiple antennas or an antenna array.

Referring now to FIG. 2, example diagrams 200, 250 of known sigma-delta modulators (SDMs) with nth order continuous-time loop filters ($H_1(s)$-$H_n(s)$ 208, 258), core ADCs 216, 266 and distributed feedback digital-to-analog converters (DACs) ($b_1$-$b_n$) 212, 262 is illustrated. The second example diagram 250 illustrates a known sigma-delta modulator with signal-feedforward coefficients. The signal transfer function (STF) and noise transfer function (NTF) are determined by the choice of continuous-time loop filers ($H_1(s)$-$H_n(s)$ 208, 258) as well as the gains of the digital-to-analog converters (DACs) ($b_1$-$b_n$) 212, 262.

Sigma-delta modulation (SDM) is a method for encoding analog signals in an ADC, e.g. converting analog input signals 202, 252 into digital signals, e.g. output 210, 260. All SDM structures realize the shaping of noise with an error minimizing feedback loop in which the analog input signal 'x' 202, 252 is compared with an analog version of the quantized digital output signal 'y', 210, 260. The difference between these two signals is frequency weighed with the continuous-time loop filers ($H_1(s)$-$H_n(s)$ 208, 258). Differences between the input signal x 202, 252 and output signal 'y' 210, 260 that fall in the signal band are passed to the output without attenuation, out-of-band differences are suppressed by the digital continuous-time loop filters ($H_1(s)$-$H_n(s)$ 208, 258). The result of the weighing is passed to the quantizer, which generates the next output value 'y'. The output 'y' is also fed back to the input, to be used in the next comparison. A practical loop-filter realization consists of additional points, integrator sections, feed-forward coefficients ai 204, 254 and feed-back coefficients bi 212, 262 and multiple summing junctions 206, 256. The result of this strategy is a close match of input signal and quantized output in the pass-band of the filter, and shaping of the quantization errors.

A temporary use of a lower-resolution signal in an SDM simplifies circuit design and improves efficiency. An SDM may also be used to convert high bit-count, low-frequency digital signals into lower bit-count, higher-frequency digital signals, for example as part of the process to convert digital signals into an analog form as part of a digital-to-analog converter (DAC). Hence, SDMs also find applicability in a large number of transmitter paths, as well as receiver paths.

SUMMARY OF THE INVENTION

The present invention provides a wireless communication unit, sigma-delta modulation circuit and method for beam steering, as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 illustrates various block diagrams of known MISO and MIMO receiver architectures.

FIG. 2 illustrates example diagrams of a known sigma-delta modulator with nth order continuous-time loop filter and distributed feedback digital-to-analog converters (DACs) and a known sigma-delta modulator with signal-feedforward coefficients.

DETAILED DESCRIPTION

Figure 3:
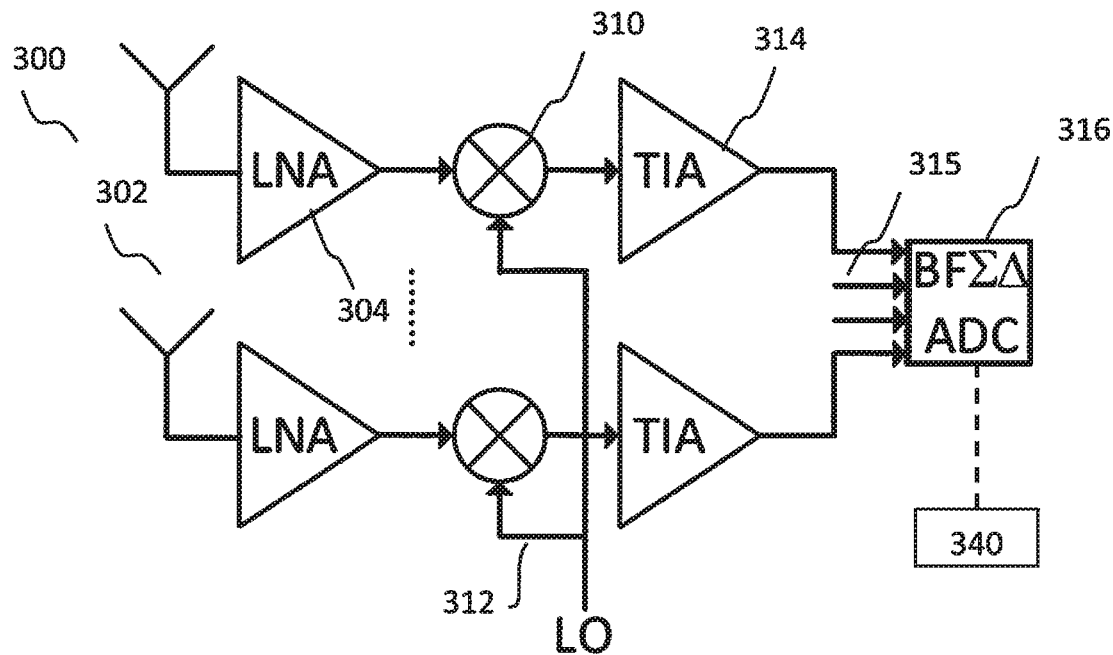
FIG. 3 illustrates a first example block diagram of a communication unit comprising a phased array system that includes a MISO receiver architecture that employs beam steering in a beam steering sigma-delta (BSΣΔ) ADC, according to example embodiments of the invention.

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

The inventor has recognised a limitation with known SDMs in that they are limited to a single input. Consequently, the inventor has recognised and appreciated mechanisms to improve the performance of SDMs by incorporating multiple multi-phase input signals and developing ways to combine and adjust various of the multiple multi-phase input signals to improve a performance of a communication unit that utilises SDMs. For example, the inventor has proposed using a modified SDM to assist in providing improved beam steering for communication units (with transmitters and/or receivers) that use multiple antennas or an antenna array. Furthermore, the inventor has also proposed using a modified SDM to assist in providing improved image rejection of quadrature input signals by appropriate and controlled adjustment of feedforward coefficients in an SDM.

Although examples of the invention are described with reference to multiple different inputs to an ADC in a MISO receiver or MIMO receiver with n antenna's and m sigma-delta ADCs, say for $5^{th}$ Generation communications, it is envisaged that the examples herein described may equally be employed in a phased array system for general wireless communication applications and communication units, such as base stations, as well as radar, wireless local area networking (WLAN), integrated Services Digital Broadcasting—Terrestrial (ISDB-T), WiFi, etc. In the context of examples of the invention, it is envisaged that multiple instantiations of a MISO circuit may equate to a MIMO system, and the examples herein described apply equally to both MIMO and MISO techniques.

Some examples of the invention are described with reference to a modified sigma-delta modulator (SDM) with an ADC where signal-feedforward coefficients are controlled to effect beam steering. Generally, the primary advantage of SDMs is their ability to realize signal selectivity in the frequency domain. For example, SDMs push the quantization noise outside a chosen signal band, so that the signal purity of the wanted signal optimally benefits from a given over-sampling ratio (OSR) via noise shaping. The selectivity in the frequency domain is possible thanks to a suitable design of the SDM loop filter, together with an application and adjustment of SDM coefficients, a number of quantizer bits adopted, a number of loops, the OSR, etc. Examples of the invention have adapted the known sigma-delta modulator with signal-feedforward coefficients to apply a signal selectivity feature within the SDM in order to effect beam steering in the spatial domain. In this manner, the SDM components and feedforward paths are adjustably controlled to predominantly (or only) convert and analyse data received from a desired and particular spatial direction. Effectively, in this manner, the SDM is capable of processing multiple input streams, whilst effectively rejecting interferers and blockers based on their spatial properties or images based on their phase properties.

Examples of the invention are also described with reference to a sigma-delta ADC that is modified to perform image rejection (IR) of input quadrature (IQ) signals, which would ordinarily be degraded in a presence of a quadrature phase error ϕ or gain mismatch a between I-channels and Q-channels. Ordinarily, any phase error would introduce crosstalk between the channels, whilst gain mismatch results in imperfect cancellation. Examples of the invention are able to remove, or at least lessen, these effects within an SDM with appropriate control and adjustment of feedforward coefficients.

Examples of the invention are described with reference to sigma-delta ADC, as the loop filter in such designs is used to achieve a particular transfer function. In examples of the invention, it is envisaged that the examples herein described may equally be employed in other ADC architectures, such as feedforward or feedback type, 1-bit or multi-bit, MASH, discrete-time, continuous-time etc. Examples of the invention may also implement the loop filter as a digital or analog filter. Examples of the invention may also be applicable to any sigma-delta modulator architecture, e.g. with distributed feedforward coefficients or combined distributed feedback/feedforward. It is also envisaged that examples of the invention are applicable to loop filters with internal local feedback and local feedforward paths from any internal node to another.

Although examples of the invention are described with reference to a MISO or MIMO receiver architecture, it is envisaged that examples of the invention may be applied to any communication system or communication unit that has multiple inputs.

The inventor of the present invention has recognized and appreciated that it would be advantageous to develop a communication unit with a phased array system, which employed a simplified beam steering technique. In some examples, a new SDM architecture is proposed that provides a sigma-delta ADC that is configured to perform the beam steering internally to the ADC. In this manner, a beam steering sigma-delta ADC architecture is proposed that does not require an analog phase-shifter in the signal path, or poses a penalty on the ADC dynamic range.

Figure 6:
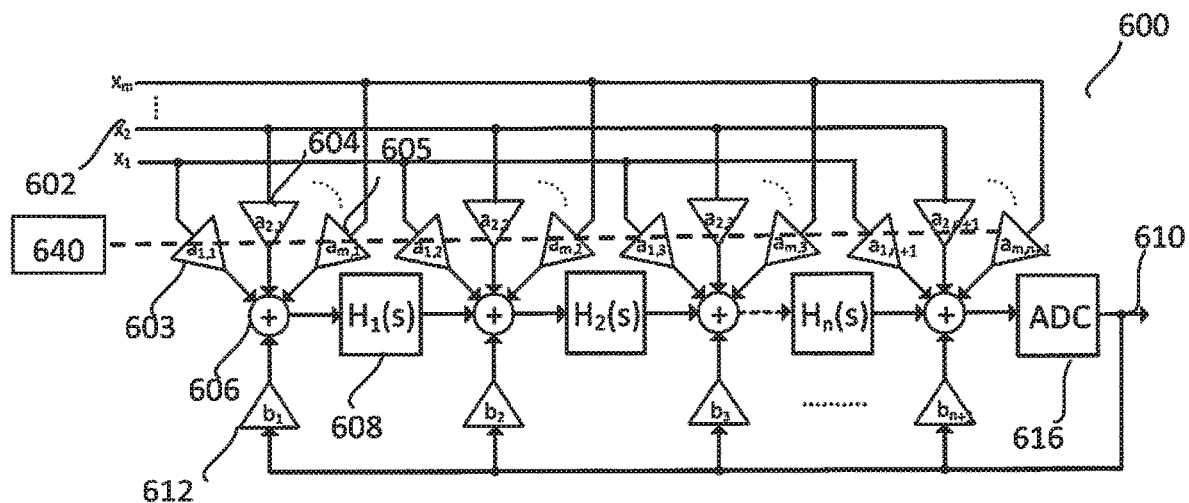
FIG. 6 illustrates an example block diagram of a sigma-delta modulator, namely a BSΣΔ ADC with an nth order continuous-time loop filter with beam steering feedforward coefficients, according to example embodiments of the invention.
Figure 8:
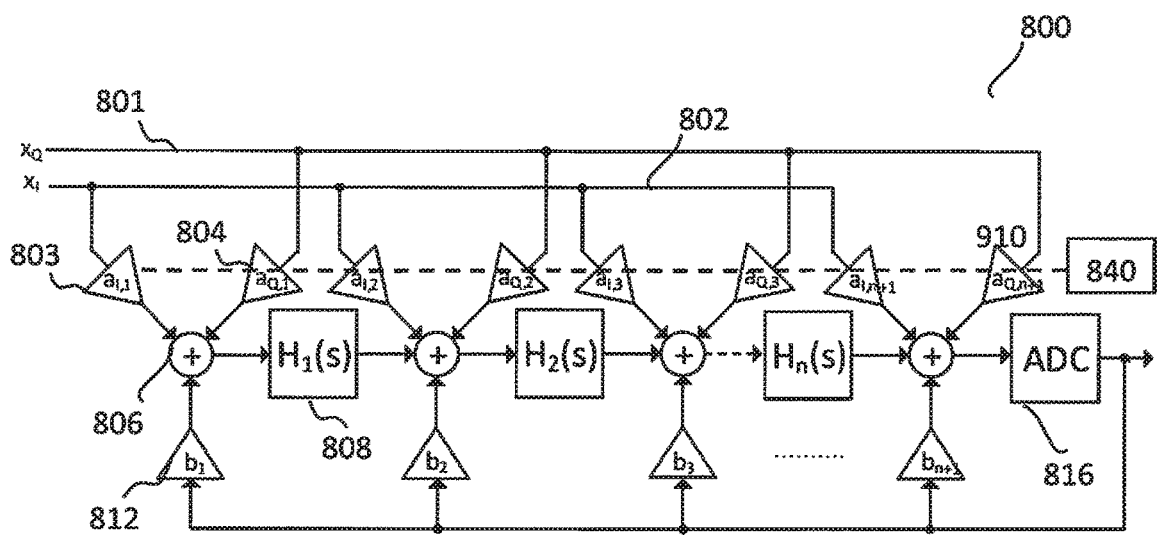
FIG. 8 illustrates an alternative example of a quadrature (IQ) sigma-delta modulator that employs image rejection in a ΣΔ ADC, according to some example embodiments of the invention.

Examples of the invention propose that, instead of injecting one input signal 'x' in the sigma-delta modulator loop filter, multiple signals from a MIMO or MISO receiver are injected with different signal feedforward coefficients, as explained further with regard to FIG. 6 and FIG. 8. By optimizing the different signal transfer functions (STFs) through the sigma-delta modulator, interferers in certain frequency ranges can be rejected whilst the wanted signals can be concurrently added in phase.

Thus, in some examples, at least one sigma-delta modulator is configured to receive multiple multi-phase input signals (in a transmit sense or a receive sense and/or in a quadrature form) and identify from the multiple multi-phase input signals at least one of: a wanted signal, an interference signal. Thereafter, a controller coupled to the at least one sigma-delta modulator is configured to adjust the at least one signal-feedforward coefficient of the at least one sigma-delta modulator when combining the multiple multi-phase input signals. The adjustment may be to reduce a level of interference in a received signal at an antenna or an array of antennas. The adjustment may be to steer a beam of the communication unit, in a transmit sense or in a receive sense, of an array of antennas. The adjustment may be to reduce a level of an image signal, say in a quadrature signal implementation. In some examples, the signal feedforward coefficients may be implemented with simple adjustable resistors or adjustable capacitors. In alternative examples the signal feedforward coefficients may be implemented as adjustable passive or active filters. In this manner, the adjustable nature of the signal feedforward coefficients enables the sigma-delta modulator to react to whether (or not) a particular signal is wanted and adjusted a beam steering function of the communication unit within the SDM and/or an image signal in response thereto.

Referring now to FIG. 3, a first example block diagram of a communication unit 300 comprising a phased array system that includes a MISO receiver architecture that employs beam steering in a beam steering sigma-delta (BSΣΔ) ADC is illustrated, according to example embodiments of the invention. In a transmit or receive sense, the beam steering (BS) may encompass or be replaced by beam forming (BF) and as such the terms beam steering and beam forming may be used interchangeably hereafter. The first example block diagram of a communication unit 300 is configured to perform beam steering of a wireless signal received across a plurality (or array) of receiver antennas 302 in a single beam steering sigma-delta ADC 316 that includes multiple inputs 315. Advantageously, no analog phase shifting components are required to adjust the phase of the received and down-converted RF signal, as beam steering is performed internally in the BSΣΔ ADC 316. In this example block diagram of a communication unit 300, the received signals are provided to respective LNAs 304 from the plurality (or array) of receiver antennas 302. The outputs of the LNAs 304 are provided to respective down-mixers 310 which also receive respective LO signals 312. The output analog baseband signal is input to a TIA 314 and then each amplified signal is provided to the single beam steering sigma-delta ADC 316 in order to produce a digital output.

The beam steering sigma-delta ADC 316 is able to remove (or substantially remove) any unwanted signals based on spatial selectivity and, hence, relax the dynamic range requirements for all electronic building blocks.

Figure 4:
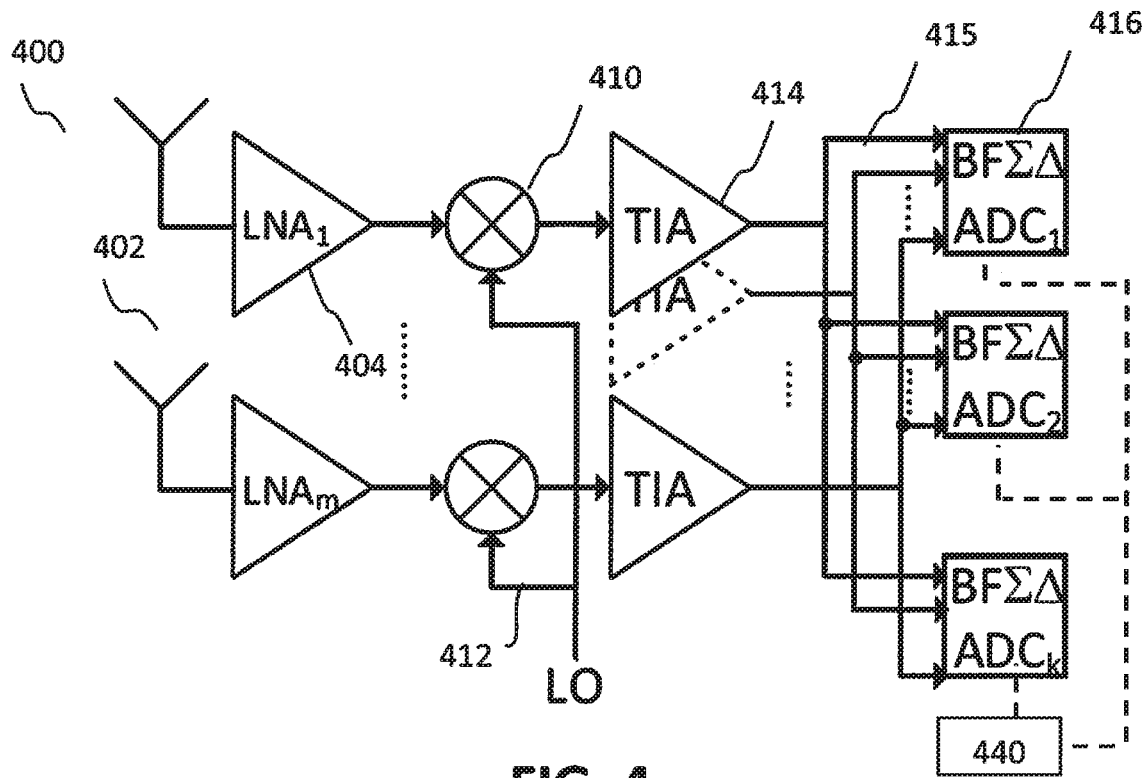
FIG. 4 illustrates a second example block diagram of a communication unit comprising a phased array system that includes a MIMO receiver architecture that employs beam steering in a BSΣΔ ADC with k outputs and with beam steering performed across k BSΣΔ ADCs, according to example embodiments of the invention.

Referring now to FIG. 4, a second example block diagram of a communication unit comprising a phased array system that includes a MIMO receiver architecture that employs beam steering in a BSΣΔ ADC with k outputs and with beam steering performed across k BSΣΔ ADCs is illustrated, according to example embodiments of the invention. If k outputs are required, only k medium resolution BSΣΔ ADCs are needed for m antenna signals, which drastically reduces the number of required ADCs as well as the ADC power, as compared to a digital beam steering receiver where m ADCs are needed with high dynamic range.

The second example block diagram of a communication unit 400 is configured to perform beam steering of a wireless signal received across a plurality (or array) of receiver antennas 402 using multiple beam steering sigma-delta ADCs 416 that includes multiple inputs 415 with a respective input 415 fed from a respective antenna 402. Advantageously, no analog phase shifting components are required to adjust the phase of the received and down-converted RF signal, as beam steering is performed internally in the BSΣΔ ADC 416. In this second example block diagram of a communication unit 400, the received signals are provided to respective LNAs 404 from the plurality (or array) of receiver antennas 402. The outputs of the LNAs 404 are provided to respective down-mixers 410 which also receive respective LO signals 412. The output analog baseband signal is input to a TIA 414 and then each amplified signal is provided to each of the multiple beam steering sigma-delta ADCs 416 in order to produce respective digital outputs that are to be combined.

Again, the beam steering sigma-delta ADC 416 is able to remove (or substantially remove) any unwanted signals based on spatial selectivity and, hence, relax the dynamic range requirements for all electronic building blocks.

Figure 5:
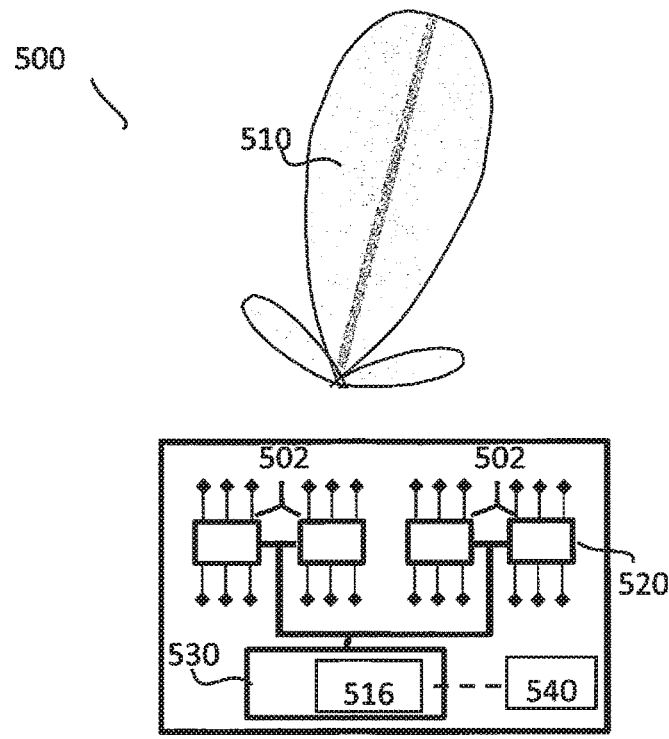
FIG. 5 illustrates an example block diagram of a beam steering communication unit with one or more BSΣΔ ADCs, according to example embodiments of the invention.

FIG. 5 illustrates an example block diagram of a beam steering communication unit 500 with one or more BSΣΔ ADCs, according to example embodiments of the invention. In this beam steering communication unit 500, an antenna radiation pattern 510 is formed from a plurality of transceivers 520 and antennas 502. A baseband and digital processing circuit 530 receives multiple input signals from the plurality of transceivers 520 and antennas 502 and the (transmit and receive) signals are processed in a beam steering sigma-delta ADC 516, whose coefficients are controlled and adjusted by controller 540. This figure is only used to show an antenna 'beam', with nulls to reduce interference.)

In some examples, the controller 540 may be configured to perform an angle of arrival estimation calculation between respective antenna array elements of a phased antenna array and, in response thereto, adjust at least one signal-feedforward coefficient of at least one beam steering sigma-delta ADC 516 to assist beam steering of the phased antenna array.

FIG. 6 illustrates an example block diagram of a sigma-delta modulator, namely a BSΣΔ ADC 600 with an nth order continuous-time loop filter with beam steering feedforward coefficients, configured according to example embodiments of the invention. The BSΣΔ ADC 600 includes a number of components from the known sigma-delta modulators (SDMs) (for example with nth order continuous-time loop filters ($H_1(s)$-$H_n(s)$) 258), core ADCs 266 and distributed feedback digital-to-analog converters (DACs) ($b_1$-$b_n$) 262 and signal-feedforward coefficients from FIG. 2). Examples of the invention provide additional signal feedforward coefficients $a_1$-$a_n$, 603, 604, 605 that are specifically configured to perform beam steering of the input signals 602 from each of the receiver paths and antennas (for example within an antenna array). In examples of the invention, the STF of the BSΣΔ ADC 600 can be independently defined from the NTF. In some examples, the order of the STF is equal to the order of the sigma-delta modulator (n). By tuning the individual coefficients $a_1$-$a_n$ 603, 604, 605, across each stage of the BSΣΔ ADC 600, where one stage includes a plurality of signal feed forward coefficients, a summing junction to add to a respective feedback/gain signal and a filter, the phase and magnitude of the STF can be tuned in a frequency dependent way, such that controller 640 is able to implement beam steering of signals from within the BSΣΔ ADC 600. The signal transfer function (STF) and noise transfer function (NTF) are determined by the choice of continuous-time loop filters ($H_1(s)$-$H_n(s)$) 608 and the gains of the DACs ($b_1$-$b_n$) 612.

Thus, in this manner, instead of injecting a single input signal 'x' in a sigma-delta modulator loop filter in a known sigma-delta modulator, such as those illustrated in FIG. 2, examples of the invention employ an injection of multiple signals, say from multiple paths of a MIMO or MISO receiver, and the controller 640 applies different signal feedforward coefficients. By optimizing the different STFs, interferers in certain frequency ranges may be rejected (e.g. by adding interference signals 'out-of-phase') whilst the wanted signals may be concurrently added 'in-phase'. The signal feedforward coefficients may be implemented with adjustable resistors or capacitors, but in some examples the signal feedforward coefficients may also be implemented as adjustable or digitally controlled passive or active filters in order to adapt the BSΣΔ ADC 600 to the beam steering requirements.

Figure 7:
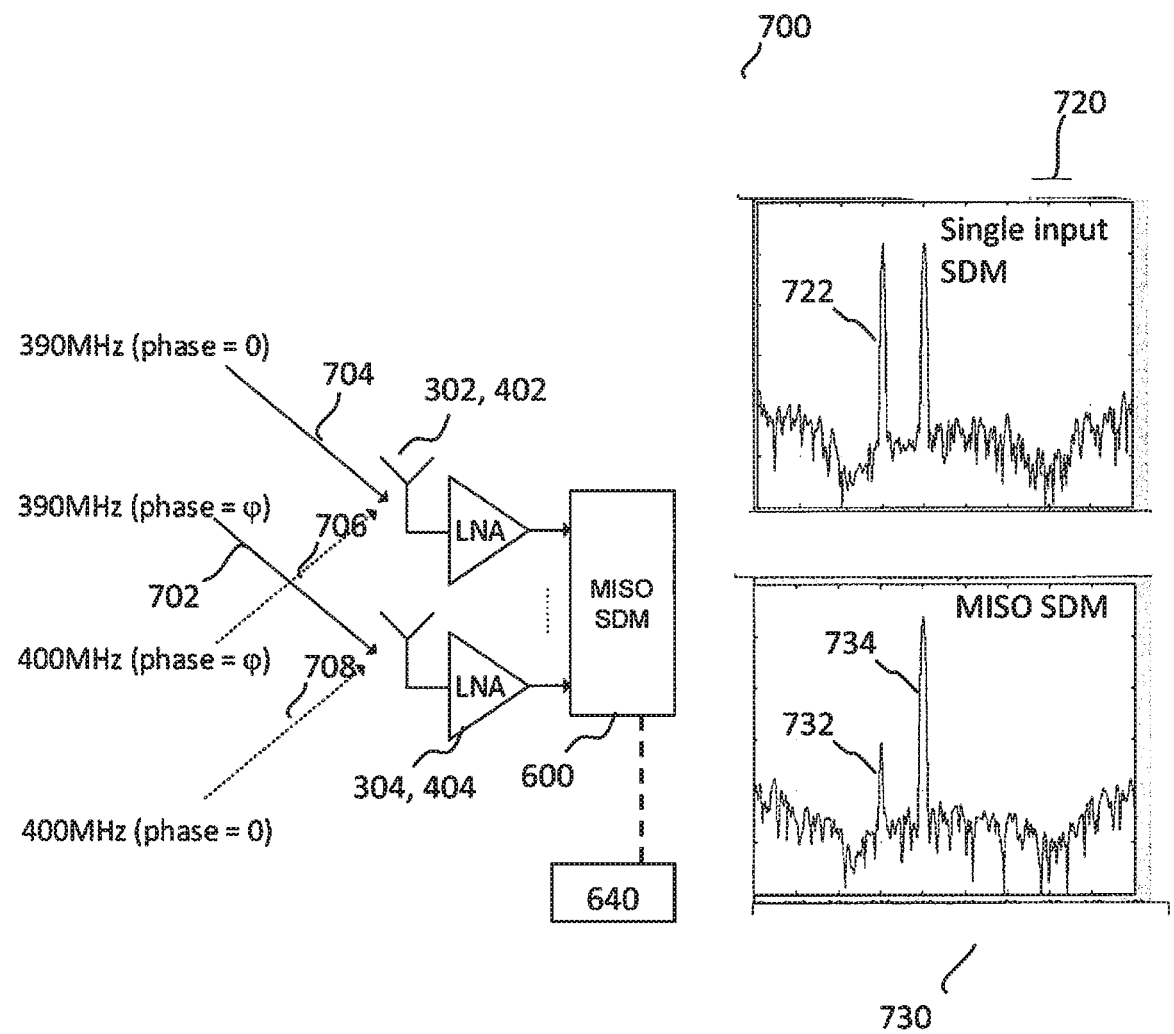
FIG. 7 illustrates a further example block diagram of a beam steering communication unit that shows a reduction in an interference signal, according to example embodiments of the invention.

Referring now to FIG. 7, a further example block diagram illustrates an overview of a beam steering communication unit 700 with a BSΣΔ ADC 600 of FIG. 6 that is receiving a wanted signal and an interfering signal, according to example embodiments of the invention. The beam steering communication unit 700 receives, via antennas 302, 402 and LNAs 304, 404, a desired signal at 390 MHz, for example with a first phase (=0) 704 and a second phase (=φ) 702, as well as an interference signal at, say, 400 MHz, for example also with a first phase (=0) 706 and a second phase (=φ) 708. The down-converted signals, once routed to BSΣΔ ADC 600, are adjusted by controller 640 according to the determined interference. The down-converted signals are adjusted by tuning, say, the individual coefficients $a_1$-$a_n$ 603, 604, 605 of FIG. 6 to effect a particular beamform/beam steered shape. In this manner, a reduction in the interference signal may be achieved.

FIG. 7 also shows a first graph 720 of a known single input SDM, such as the one illustrated in FIG. 2, with a high level of the interference 722 that would have resulted from the interfering signals 702, 704 at 390 MHz. In contrast, FIG. 7 also shows a second graph 730 of a MISO SDM, according to example embodiments of the invention, whereby the second graph 730 illustrates an increased level of the wanted signal 734 due to in-phase addition of the received wanted signals 706, 708 at 400 MHz and, accordingly, a significantly reduced level of interference 732 due to out-of-phase addition of the interference signals 702, 704. With fine calibration of the signal-feedforward coefficients of BSΣΔ ADC 600, the level of interference 732 may be reduced further. The amount of rejection depends on how accurately the STFs can be tuned to shift signals 702 and 704 180 degrees out-of-phase while the magnitudes are equal. As wanted signals 706 and 708 have an opposite phase relationship, as compared to interference signals 704 and 702, they are not out-of-phase and will add.

Referring now to FIG. 8, an alternative example of a quadrature (IQ) sigma-delta modulator that employs image rejection in a ΣΔ ADC 800 is illustrated, according to some example embodiments of the invention. In this example, there are two quadrature input signals XQ 801 and XI 802 following a quadrature down-conversion of the signals received at one antenna or multiple antennas. In this example, multiple antennas are not needed, as the use of a ΣΔ ADC 800 to perform image rejection/reduction is independent of a number of antennas employed by the communication unit.

In this example, the two quadrature input signals XQ 801 and XI 802 are in the desired frequency range, where STF1 and STF2 are designed to have equal gain transfers and 90 degrees phase difference. In this example, the controller 840 connected to the BSΣΔ ADC 800 may be arranged to suppress image frequencies with appropriate phase adjustment of the the individual coefficients $a_1$-$a_n$ 803, 804, across each of stage of the BSΣΔ ADC 800, whilst the wanted signals will be constructively added. As the equal gain and 90 degrees phase requirements can only be met in a limited bandwidth, the architecture of FIG. 8 is particularly useful for narrowband receiver applications. Thus, in this context, it is envisaged that the concept of 'interference signal' reduction encompasses quadrature 'image signal' reduction. Advantageously, in this example, only one ADC 816 is used, compared to a known SDM implementation for quadrature signals that would require an ADC for each of the quadrature paths.

Figure 9:
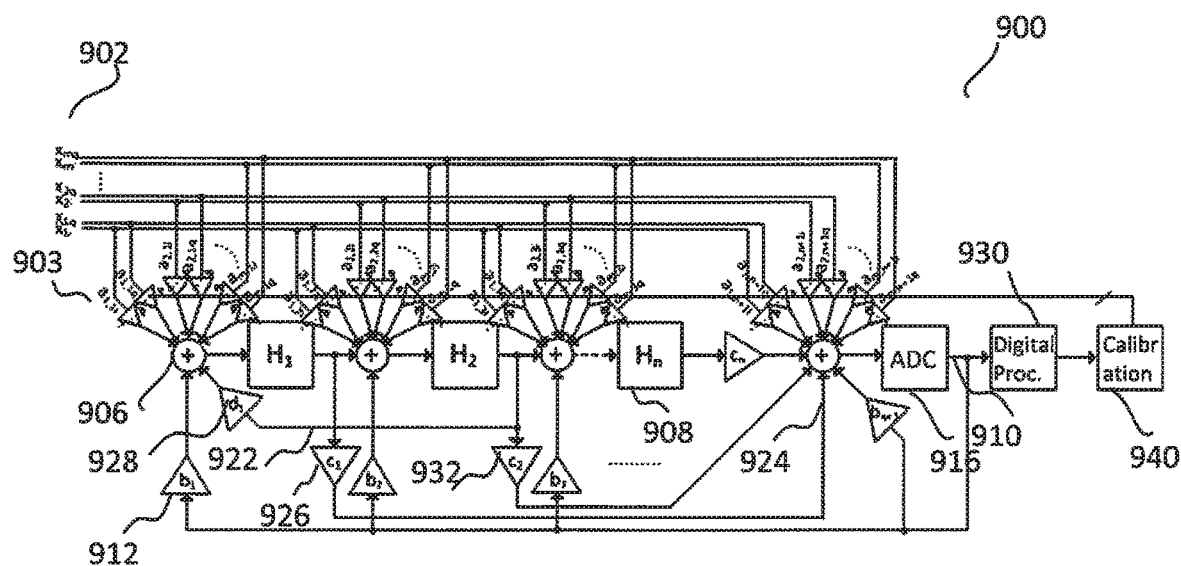
FIG. 9 illustrates a further example of a sigma-delta modulator that employs image rejection and beam steering in a BSΣΔ ADC with multiple pairs of quadrature (IQ) input signals, according to some example embodiments of the invention.

It is noted here that the multi-phase combining of examples of the invention is not limited to two phase complex signals, but in other examples the concepts herein described may be implemented with three or more phases. Referring now to FIG. 9, a further example of a SDM is illustrated, according to some example embodiments of the invention, whereby a quadrature (IQ) sigma-delta modulator that employs image rejection is combined with a beam steering summation operation in a ΣΔ ADC 900, where all inputs are complex signals. In this example, there are multiple pairs of quadrature input signals XQ and XI 902 following quadrature down-conversion of multiple signals received at the antennas. In this example, the multiple pairs of quadrature input signals multiple pairs of are in the desired frequency range, where STF1 and STF2 are designed to have equal gain transfers and 90 degrees phase difference. In this example, the SDM is also configured to perform beam steering as well as image rejection. The output of the ADC 916 is input to a digital processor 930 that, in some examples, is configured to identify a frequency and level of the interference, to influence beam steering and/or suppress image frequencies with appropriate phase adjustment of the the individual coefficients $a_1$-$a_n$ 903 across each of stage of the ΣΔ ADC 900. Again, the adjustments of the individual coefficients $a_1$-$a_n$ 903 ensure that the wanted signals will be constructively added.

As the equal gain and 90 degrees phase requirements can only be met in a limited bandwidth, the architecture of FIG. 9 is particularly useful for narrowband receiver applications. Thus, in this context. It is envisaged that the concept of 'interference signal' reduction may encompass 'image signal' reduction. Advantageously, in this example, only one ADC 916 is used, compared to a known SDM implementation for quadrature signals that would require an ADC for each of the quadrature paths.

In the ΣΔ modulator 900 a number of local (i.e. internal) feedback or feedforward paths between internal nodes may be employed. For example, an output of the second filter (H2) is fed back to the first summing junction via feedback path 922 and a gain or phase-adjustment element (d1) 928. As shown, the output of second filer (H2) is also fed forward to the final summing junction via a further gain or phase-adjustment element (c2) 932, together with an output of the first filter (H1) via feedforward path 924 and a yet further gain or phase-adjustment element (c1) 926. Furthermore, the filter blocks Hn may be implemented as passive, active, continuous-time, discrete-time, etc., filters. The ADC in ΣΔ modulator 900 may be a 1-bit or multi-bit ADC. It is also envisaged in other examples that modulator 900 may be embedded in a cascaded or MASH architecture.

In some examples of the invention it is envisaged that a controller or detector may initiate a (re-) calibration operation 940, for example following a detection of a spatial requirement for the SDM, or in response to a determined (too high) level of quadrature image signal, or in response to temperature or supply voltage changes of the communication unit.

In some examples of the invention it is envisaged that one or more loop filter parameters within the SDM may additionally be adjusted in order to influence the frequency-dependent gain and/or phase transfer adjustment for interference (or quadrature image) cancellation, within the SDM. In a number of examples, however, the loop filter is fixed and may be analog or digital in form and designed in the 'S' domain or the 'Z' domain.

In some examples of the invention, the use of feedforward coefficients to support a combination of multiple, multi-phase signals, individually controlled in a SDM may be used in one or more of the above ways all of the time. In other examples, it is envisaged that the use of (additional) feedforward coefficients, may be selectively introduced and a single feedforward path to be supported and backward compatible with previous communication standards or systems by configuring the (additional) feedforward coefficients as a '0'. In this manner, the (additional) feedforward coefficients may be switched in the additional feedforward paths when an improved performance is desired by making the feedforward coefficients a non-zero value.

Although examples of the invention have been described with reference to at least one sigma-delta modulator having an input that is configured to receive multiple multi-phase input signals in a receiver, where a controller is configured to adjust at least one signal-feedforward coefficient of the at least one sigma-delta modulator when combining the multiple multi-phase input signals, it is envisaged that examples of the invention may be employed in a transmitter sense, for example where the modified SDM(s) is/are used in a DAC.

Figure 10:
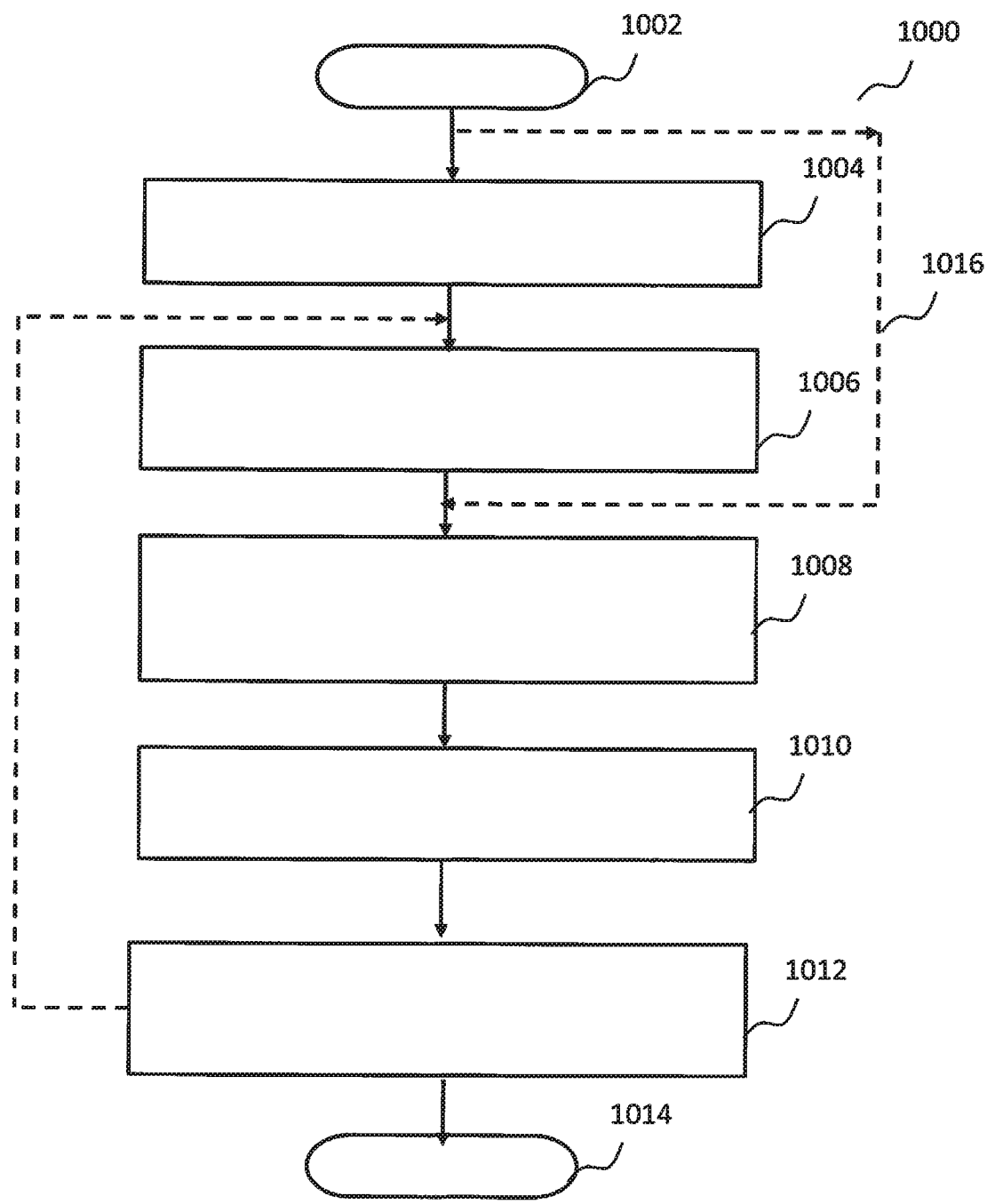
FIG. 10 illustrates an example flowchart of a beam steering operation in a communication unit comprising a phased array system that includes a MISO receiver architecture that employs beam steering in a beam steering sigma-delta (BSΣΔ) ADC, according to example embodiments of the invention.

Referring now to FIG. 10, an example flowchart 1000 of a frequency adjustment thereof is illustrated according to example embodiments of the invention. The flowchart encompasses receiving multiple multi-phase input signals and adjusting at least one signal-feedforward coefficient of at least one sigma-delta modulator when combining the multiple multi-phase input signals.

In a first example, the example flowchart 1000 encompasses a beam steering operation in a communication unit comprising a phased array antenna system that includes a MISO or MIMO receiver architecture that employs beam steering in a beam steering sigma-delta (BSΣΔ) ADC is illustrated. In this first example, the flowchart 1000 encompasses adjustment of the signal feedforward coefficients to reduce a level of an interference signal received at the antennas or antenna array. In a second example, the example flowchart 1000 encompasses adjustment of the signal feed-forward coefficients to reduce a level of interference, which in this example includes image signals, say in a quadrature IQ implementation.

The example flowchart 1000 starts at 1002 and, when the frequency-dependent adjustment of signals relates to removing interference received at the antennas via, say, a beam-steering technique, the flowchart moves to 1004 where an N-unit phased array antenna system is initialized, and a controller (e.g. controller 340 or 440 of FIG. 3 or FIG. 4) communicates to respective transceiver units and at least one BSΣΔ ADC.

At 1006, at least one sigma-delta modulator receives multiple multi-phase input signals. In the first example, in a receiver sense, the phased array antenna system receives a wanted signal and, in some examples, also receives at least one interference signal, and the received signals are identified as such and multiple multi-phase input signals passed to the at least one sigma-delta modulator. In a transmitter sense, the multiple multi-phase input signals passed to the at least one sigma-delta modulator may not include an interference signal, but may be subject to a desire by a controller to steer a transmit beam in a particular direction.

At 1008, the controller identifies a signal level of an interference frequency as well as the wanted signal frequency. In the second example, initialization of the phased array antenna system may be bypassed 1016 and the controller identifies an image frequency and phase of, say, a quadrature received signal. At 1010, the controller adjusts signal feedforward coefficients, such as signal feedforward coefficients $a_1$-$a_n$ 603, 604, 605, of FIG. 6, in at least one BSΣΔ ADC (such as BSΣΔ ADC 600) in the first example and/or a ΣΔ ADC (such as ΣΔ ADC 800) in the second example. The adjustment of the signal feedforward coefficients is performed to reduce a level of interference, which in the first example may be an interference signal received at the antenna and/or in the second example one or more image signals, say in a quadrature IQ implementation. At 1012, in the first example of a beam-steering implementation, the adjustment of the signal feedforward coefficients affects the beam steering shape or pattern of the phased array antenna system. The flowchart then ends at 1014.

In an alternative example, following the first example of a beam-steering implementation at 1012, the tuning of the feedforward coefficients may be an iterative process, to address spatial conditions that may change and which the system continuously needs to adapt to. In this example, the flowchart may loop back to 1006, as shown.

In an alternative example, if the phase relationship is static (e.g. in a complex receiver embodiment), a calibration loop may end at a certain point once the STF coefficients are settled to the optimal values. In a further alternative example, a re-calibration of the SDM may be needed in order to track any variation over temperature or supply voltage changes.

Thus, examples of the invention describe a communication unit that comprises: a plurality of antennas; a plurality of RF circuits respectively coupled to at least one of the plurality of antennas. The communication unit also includes at least one sigma-delta modulator that comprises a number of stages, each stage comprising at least one signal-feedforward coefficient, a filter and a feedback gain element, the at least one sigma-delta modulator coupled to the plurality of RF communication paths and configured to perform sigma-delta modulation. A controller is coupled to the at least one sigma-delta modulator and configured to identify, say, beam steering parameters of wireless signals received by or transmitted by the plurality of antennas and in response thereto adjust the at least one signal-feedforward coefficient of the at least one sigma-delta modulator to effect a beam steered signal. Alternatively or additionally, the controller is configured to identify at least one image signal of, say, a quadrature input and, in response thereto adjusting at least one signal-feedforward coefficient of the at least one sigma-delta modulator to effect image signal reduction.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or integrated circuit devices. Accordingly, unless implied or stated otherwise, the connections may for example be direct connections or indirect connections. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the circuit and/or component examples may be implemented as any number of separate integrated circuits or separate devices interconnected with each other in a suitable manner. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A communication unit comprising:
   at least one antenna;
   a plurality of radio frequency (RF) circuits respectively coupled to the at least one antenna;
   at least one sigma-delta modulator comprising a number of stages, each stage comprising at least one signal-feedforward coefficient, a filter and a feedback gain element, the at least one sigma-delta modulator coupled to the plurality of RF circuits and configured to perform sigma-delta modulation; and
   a controller operably coupled to the at least one sigma-delta modulator;
   wherein
   the at least one sigma-delta modulator comprises an input configured to receive multiple multi-phase input signals and the controller is configured to adjust the at least one signal-feedforward coefficient of the at least one sigma-delta modulator when combining the multiple multi-phase input signals.

2. The communication unit of claim 1 wherein each of the at least one signal-feedforward coefficients in at least one stage of the at least one sigma-delta modulator is individually adjustable by the controller.

3. The communication unit of claim 1 wherein the at least one antenna is a plurality of antennas and the controller is configured to identify beam steering parameters of wireless signals received by or transmitted from the plurality of antennas and in response thereto adjust the at least one signal-feedforward coefficient of the at least one sigma-delta modulator to effect a beam steered signal.

4. The communication unit of claim 3 wherein at least one signal-feedforward coefficient in at least one stage of the at least one sigma-delta modulator is adjusted by the controller to reduce a level of at least one interference signal.

5. The communication unit of claim 4 wherein the controller is configured to identify a signal level and frequency of the at least one interference signal and in response thereto adjust the at least one signal-feedforward coefficient of the at least one sigma-delta modulator to effect a beam-formed signal.

6. The communication unit of claim 4 wherein the controller is configured to perform an angle of arrival estimation calculation between respective antenna array elements of a phased antenna array and in response thereto adjust the at least one signal-feedforward coefficient of the at least one sigma-delta modulator to assist beam steering of the phased antenna array.

7. The communication unit of claim 1 wherein the input configured to receive multiple multi-phase input signals comprises a quadrature input, and the controller is configured to identify image signals of the quadrature input and in response thereto adjust the at least one signal-feedforward coefficient of the at least one sigma-delta modulator (816) to effect image signal reduction.

8. The communication unit of claim 1 wherein the respective antennas coupled to the plurality of transceiver circuits are configured to operate as a phased antenna array.

9. The communication unit of claim 1 wherein the at least one sigma-delta modulator is constructed as one from a group of: a feedforward type, a feedback type, a 1-bit modulation type, a multi-bit modulation type, a MASH modulator, discrete-time type modulator, a continuous-time modulator.

10. A sigma-delta modulator comprising:
a number of stages, each stage comprising at least one signal-feedforward coefficient, a filter and a feedback gain element, where the at least one sigma-delta modulator is coupled to a controller and at least one antenna via a plurality of RF circuits and configured to perform sigma-delta modulation;
wherein
the at least one sigma-delta modulator comprises an input configured to receive multiple multi-phase input signals and the controller is configured to adjust the at least one signal-feedforward coefficient of the at least one sigma-delta modulator when combining the multiple multi-phase input signals.

11. The sigma-delta modulator of claim 10, wherein each of the at least one signal-feedforward coefficients in at least one stage of the at least one sigma-delta modulator is individually adjustable by the controller.

12. The sigma-delta modulator of claim 10, wherein the at least one antenna is a plurality of antennas and the controller is configured to identify beam steering parameters of wireless signals received by or transmitted from the plurality of antennas, and in response thereto, adjust the at least one signal-feedforward coefficient of the at least one sigma-delta modulator to effect a beam steered signal.

13. The sigma-delta modulator of claim 12, wherein at least one signal-feedforward coefficient in at least one stage of the at least one sigma-delta modulator is adjusted by the controller to reduce a level of at least one interference signal.

14. The sigma-delta modulator of claim 10, wherein the input configured to receive multiple multi-phase input signals comprises a quadrature input, and the controller is configured to identify image signals of the quadrature input, and in response thereto, adjust the at least one signal-feedforward coefficient of the at least one sigma-delta modulator to effect image signal reduction.

15. A method for frequency-dependent adjustment of at least one of: gain, phase in a communication unit that comprises at least one antenna coupled to a plurality of radio frequency, RF, circuits and at least one sigma-delta modulator that comprises a number of stages, each stage comprising at least one signal-feedforward coefficient, a filter and a feedback gain element, wherein the method comprises:
receiving or transmitting at least one signal via the at least one antenna; and
performing sigma-delta modulation by the at least one sigma-delta modulator;
receiving multiple multi-phase input signals by the at least one sigma-delta modulator;
identifying from the multiple multi-phase input signals at least one of: a wanted signal, an interference signal; and
adjusting the at least one signal-feedforward coefficient of the at least one sigma-delta modulator when combining the multiple multi-phase input signals.

16. The method of claim 15 wherein the at least one antenna is a plurality of antennas and the method further comprises:
identifying beam steering parameters of wireless signals received by or transmitted from the plurality of antennas; and in response thereto
adjusting the at least one signal-feedforward coefficient of the at least one sigma-delta modulator to effect a beam steered signal.

17. The method of claim 15 wherein receiving multiple multi-phase input signals by the at least one sigma-delta modulator comprises receiving at least one quadrature input signal; wherein the method further comprises:
identifying at least one image signal of the quadrature input and, in response thereto
adjusting the at least one signal-feedforward coefficient of the at least one sigma-delta modulator to effect image signal reduction.

18. The method of claim 15, further comprising adjusting the at least one signal-feedforward coefficient of the at least one sigma-delta modulator to reduce a level of at least one interference signal.

19. The method of claim 18, further comprising:
identifying a signal level and frequency of the at least one interference signal; and
adjusting the at least one signal-feedforward coefficient of the at least one sigma-delta modulator to affect a beam-formed signal.

20. The method of claim 18, further comprising:
performing an angle of arrival estimation calculation between respective antenna array elements of a phased antenna array; and
adjusting the at least one signal-feedforward coefficient of the at least one sigma-delta modulator to assist beam steering of the phased antenna array.

* * * * *